(12) United States Patent
Jin et al.

(10) Patent No.: US 8,890,125 B2
(45) Date of Patent: Nov. 18, 2014

(54) DISPLAY APPARATUS AND ORGANIC LIGHT EMITTING DISPLAY APPARATUS

(71) Applicants: Guang-Hai Jin, Yongin (KR); Dong-Gyu Kim, Yongin (KR); Kwan-Wook Jung, Yongin (KR); Seong-Jun Kim, Yongin (KR); Moo-Jin Kim, Yongin (KR); Oh-Seob Kwon, Yongin (KR)

(72) Inventors: Guang-Hai Jin, Yongin (KR); Dong-Gyu Kim, Yongin (KR); Kwan-Wook Jung, Yongin (KR); Seong-Jun Kim, Yongin (KR); Moo-Jin Kim, Yongin (KR); Oh-Seob Kwon, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 211 days.

(21) Appl. No.: 13/651,667

(22) Filed: Oct. 15, 2012

(65) Prior Publication Data
US 2014/0014907 A1 Jan. 16, 2014

(30) Foreign Application Priority Data
Jul. 16, 2012 (KR) ........................ 10-2012-0077365

(51) Int. Cl.
*H01L 35/24* (2006.01)

(52) U.S. Cl.
USPC ..................................... 257/40; 257/E51.001

(58) Field of Classification Search
USPC ............................................ 257/40, E51.001
See application file for complete search history.

(56) References Cited

U.S. PATENT DOCUMENTS 8,168,975 B2    5/2012    Koyama et al.
2008/0137016 A1    6/2008    Kim et al.

FOREIGN PATENT DOCUMENTS

JP      2010-152376      7/2010
KR     10-2008-0053781     6/2008
KR     10-2008-0061547 A    7/2008

*Primary Examiner* — Anthony Ho
(74) *Attorney, Agent, or Firm* — Lee & Morse, P.C.

(57) ABSTRACT

A display apparatus includes a plurality of first wirings extending in a first direction and a plurality of second wirings extending in a second direction crossing the first direction. Differing first identification patterns are present on the plurality of corresponding first wirings to identify the plurality of first wirings, and differing second identification patterns are present on the plurality of corresponding second wirings to identify the plurality of second wirings.

20 Claims, 6 Drawing Sheets

DISPLAY APPARATUS AND ORGANIC LIGHT EMITTING DISPLAY APPARATUS

CROSS-REFERENCE TO RELATED PATENT APPLICATION

This application claims the benefit under 35 U.S.C. §119 of Korean Patent Application No. 10-2012-077365, filed on Jul. 16, 2012, in the Korean Intellectual Property Office, the disclosure of which is incorporated herein in its entirety by reference.

BACKGROUND

1. Field

Embodiments relate to a display apparatus and an organic light emitting display apparatus characterized by simple repair processes.

2. Description of the Related Art

Recently, conventional display apparatuses have been replaced by portable thin flat display apparatuses. Among flat display apparatuses, organic light emitting display apparatuses have advantages of a wide viewing angle, excellent contrast, and high response speed. Thus, organic light emitting display apparatuses have attracted considerable attention as next-generation display apparatuses.

An organic light emitting display apparatus includes an intermediate layer, a first electrode, and a second electrode. The intermediate layer includes an organic light emitting layer. When a voltage is applied between the first and second electrodes, the organic light emitting layer generates visible light.

SUMMARY

Embodiments are directed to a display apparatus including a plurality of first wirings extending in a first direction, and a plurality of second wirings extending in a second direction crossing the first direction. Differing first identification patterns are present on the plurality of corresponding first wirings to identify individual ones of the plurality of first wirings, and differing second identification patterns are present on the plurality of corresponding second wirings to identify individual ones of the plurality of second wirings.

A plurality of pixels may be defined at intersections of the first wirings and the second wirings. A single one of the first identification patterns may repeat with respect to a plurality of pixels defined along a single one of the first wirings. A single one of the second identification patterns repeats with respect to a plurality of pixels defined along a single one of the second wirings.

The first wirings, the second wirings, and the plurality of pixels defined by the first and second wirings may form a pixel block. A display area of the display apparatus may include a plurality of pixel blocks. The first identification patterns present on the first wirings and the second identification patterns present on the second wirings, which are included in a single pixel block, may repeat on a pixel block basis.

The first wirings may be scan wirings for supplying a scan signal to the pixels.

The second wirings may be data wirings for supplying a data signal to the pixels.

The first identification patterns may include first contact hole patterns on the first wirings. The second identification patterns may include second contact hole patterns on the second wirings.

The contact hole patterns may include differing numbers of first contact holes allocated to each of the first wirings. The second contact hole patterns may include differing numbers of second contact holes allocated to each of the second wirings.

The first contact hole patterns may include differing arrangements of first contact holes allocated to each of the first wirings. The second contact hole patterns may include differing arrangements of second contact holes allocated to each of the second wirings.

The first contact hole patterns may include differing shapes of first contact holes allocated to each of the first wirings. The second contact hole patterns may include differing shapes of second contact holes allocated to each of the second wirings.

The first contact hole patterns may include differing sizes of first contact holes allocated to each of the first wirings. The second contact hole patterns may include differing sizes of second contact holes allocated to each of the second wirings.

Embodiments are also directed to an organic light emitting display apparatus including a plurality of pixels, each pixel including an organic light emitting device, the organic light emitting device including a pixel electrode, an intermediate layer including an organic light emitting layer, a counter electrode, and a switching device, the switching device including a gate electrode and source and drain electrodes, first wirings connected to each of the plurality of pixels, the first wirings extending in a first direction, and being on a same layer as the gate electrode, and second wirings connected to each of the plurality of pixels, the second wirings extending in a second direction crossing the first direction, and being formed on a same layer as the source and drain electrodes. Differing first identification patterns are on the corresponding first wirings to identify the first wirings, and differing second identification patterns are on the corresponding second wirings to identify the second wirings.

A single one of the first identification patterns may repeat with respect to a plurality of pixels defined along a single one of the first wirings. A single one of the second identification patterns may repeat with respect to a plurality of pixels defined along a single one of the second wirings.

The first wirings, the second wirings, and the plurality of pixels defined by the first and second wirings may form a pixel block. A display area of the organic light emitting display apparatus may include a plurality of pixel blocks. The first identification patterns on the first wirings and the second identification patterns on the second wirings, which are included in a single pixel block, may repeat on a pixel block basis.

The first wirings may be scan wirings for supplying a scan signal to the pixels.

The second wirings may be data wirings for supplying a data signal to the pixels.

The first identification patterns may include first contact hole patterns on the first wirings. The second identification patterns may include second contact hole patterns on the second wirings.

The first contact hole patterns may include differing numbers of first contact holes allocated to each of the first wirings. The second contact hole patterns may include differing numbers of second contact holes allocated to each of the second wirings.

The first contact hole patterns may include differing arrangements of first contact holes allocated to each of the first wirings. The second contact hole patterns may include differing arrangements of second contact holes allocated to each of the second wirings.

The first contact hole patterns may include differing shapes of first contact holes allocated to each of the first wirings. The second contact hole patterns may include differing shapes of second contact holes allocated to each of the second wirings.

The first contact hole patterns may include differing sizes of first contact holes allocated to each of the first wirings. The second contact hole patterns may include differing sizes of second contact holes allocated to each of the second wirings.

BRIEF DESCRIPTION OF THE DRAWINGS

Features will become apparent by describing in detail exemplary embodiments thereof with reference to the attached drawings in which.

DETAILED DESCRIPTION

Figure 1:
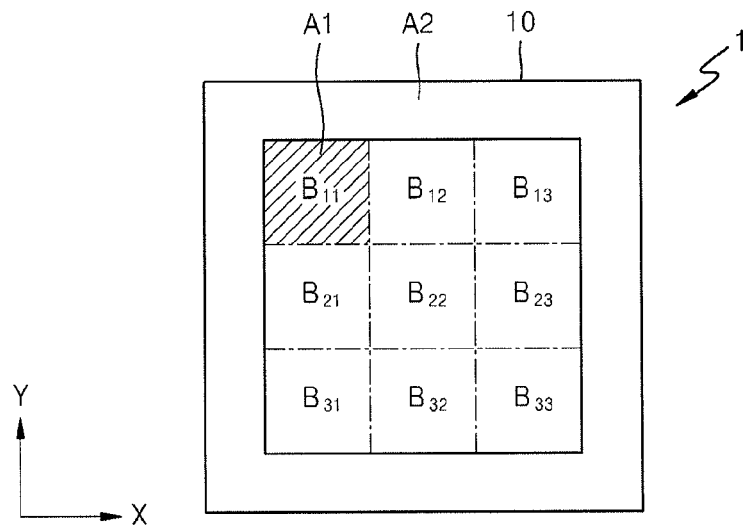
FIG. 1 illustrates a schematic top view of an organic light emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Figure 2:
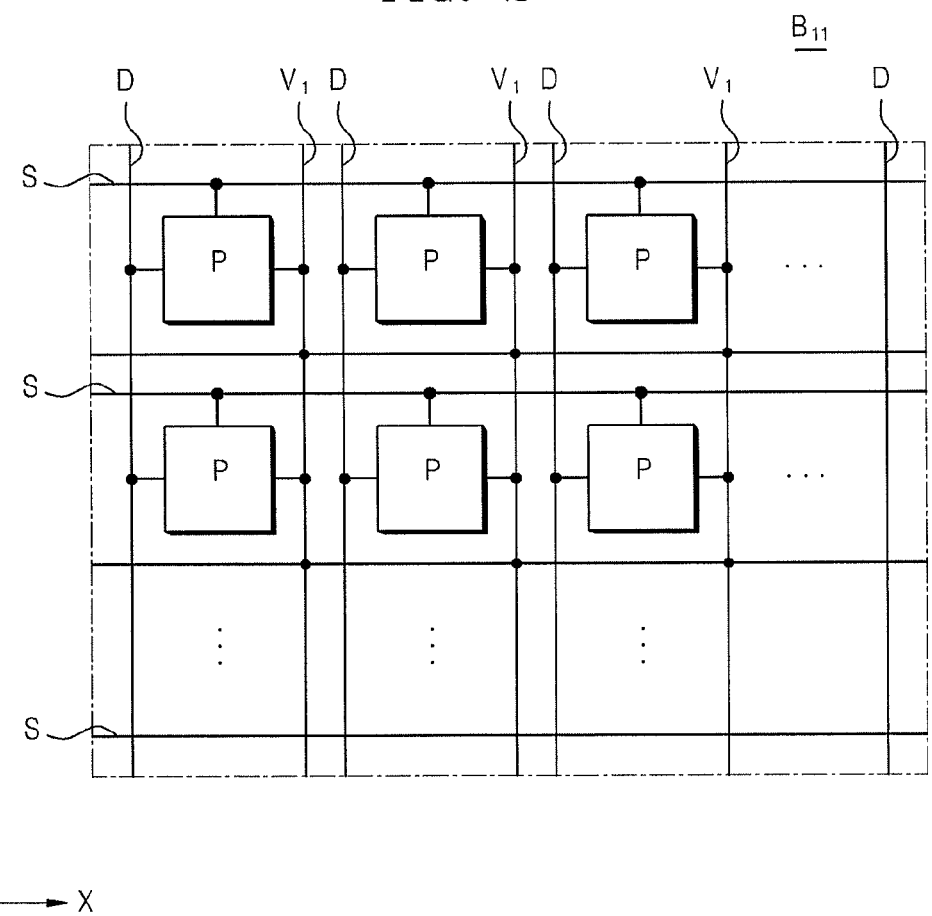
FIG. 2 illustrates a schematic diagram of a wiring structure of a pixel block in the organic light emitting display apparatus of FIG. 1.

FIG. 1 is a schematic top view of an organic light emitting display apparatus 1 according to an embodiment, and FIG. 2 is a schematic diagram of a wiring structure of a first-first pixel block B11 in the organic light emitting display apparatus of FIG. 1.

Referring to FIGS. 1 and 2, the organic light emitting display apparatus 1 includes a display area A1 and a non-display area A2, which are formed on a substrate 10.

An image is displayed in the display area A1 that is formed in an area including the center of the substrate 10, and the non-display area A2 may be arranged around the display area A1.

The display area A1 includes a plurality of pixels P providing an image.

Each pixel P may be defined by a scan wiring S extending in a first direction X and orthogonally crossing a data wiring D extending in a second direction Y. The data wiring D applies a data signal provided by a data driver (not shown) included in the non-display area A2 to each pixel P, and the scan wiring S applies a scan signal provided by a scan driver (not shown) included in the non-display area A2 to each pixel P. Although FIG. 2 shows that the data wiring D extends in the second direction Y while the scan wiring S extends in the first direction X, in other implementations, the data wiring D and the scan wiring S may be respectively extend in the first direction X and the second direction Y.

Each pixel P is connected to a first power supply line $V_1$ extending in the second direction Y. The first power supply line $V_1$ applies a first voltage source (ELVDD(m), refer to FIG. 3) provided by a first power driver (not shown) included in the non-display area A2 to each pixel P. Although not shown in FIG. 2, a second voltage source (ELVSS(n), refer to FIG. 3) is supplied to each pixel P. Each pixel P controls a current capacity supplied from the first voltage source ELVDD(m) to the second voltage source ELVSS(n) via an organic light emitting device (OLED) (refer to FIG. 3) in response to a data signal. Then, a predetermined luminance of light is generated by the OLED.

Figure 3:
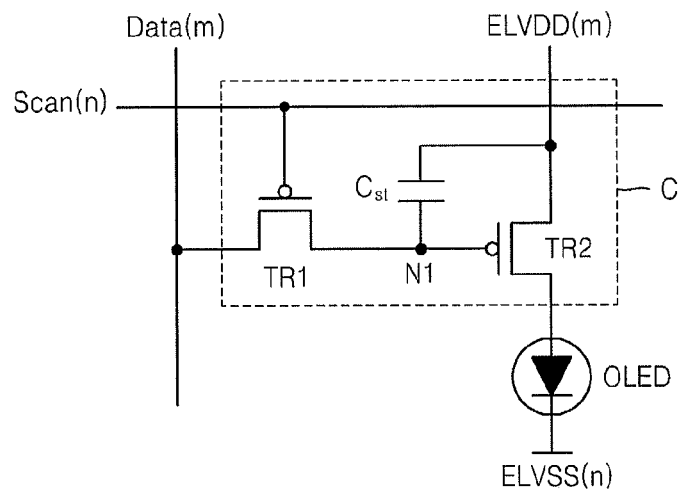
FIG. 3 illustrates a circuit diagram of a single pixel of the pixel block of FIG. 2.

FIG. 3 is a circuit diagram of a single pixel of the first-first pixel block $B_{11}$ of FIG. 2.

Referring to FIG. 3, the pixel includes an OLED and a pixel circuit C for supplying a current to the OLED.

A pixel electrode of the OLED is connected to the pixel circuit C, and a counter electrode of the OLED is connected to the second voltage source ELVSS(n). The OLED generates light of a predetermined luminance in response to the current supplied from the pixel circuit C.

An organic light emitting display apparatus having an active matrix scheme includes at least two transistors and at least one capacitor. In detail, the organic light emitting display apparatus having an active matrix scheme includes a switching transistor for delivering a data signal, a driving transistor for driving an OLED in response to the data signal, and a capacitor for maintaining a data voltage.

A gate electrode of a first transistor TR1 is connected to a scan wiring S (refer to FIG. 2), a first electrode of the first transistor TR1 is connected to a data wiring D (refer to FIG. 2), and a second electrode of the first transistor TR1 is connected to a first node N1. A scan signal Scan(n) is input to the gate electrode of the first transistor TR1, and a data signal Data(m) is input to the first electrode of the first transistor TR1.

A gate electrode of a second transistor TR2 is connected to the first node N1, a first electrode of the second transistor TR2 is connected to the first voltage source ELVDD(m), and a second electrode of the second transistor TR2 is connected to the pixel electrode of the OLED. The second transistor TR2 functions as a driving transistor.

A first capacitor $C_{st}$ is connected between the first node N1 and the first electrode of the second transistor TR2, i.e., the first voltage source ELVDD(m).

Figure 4:
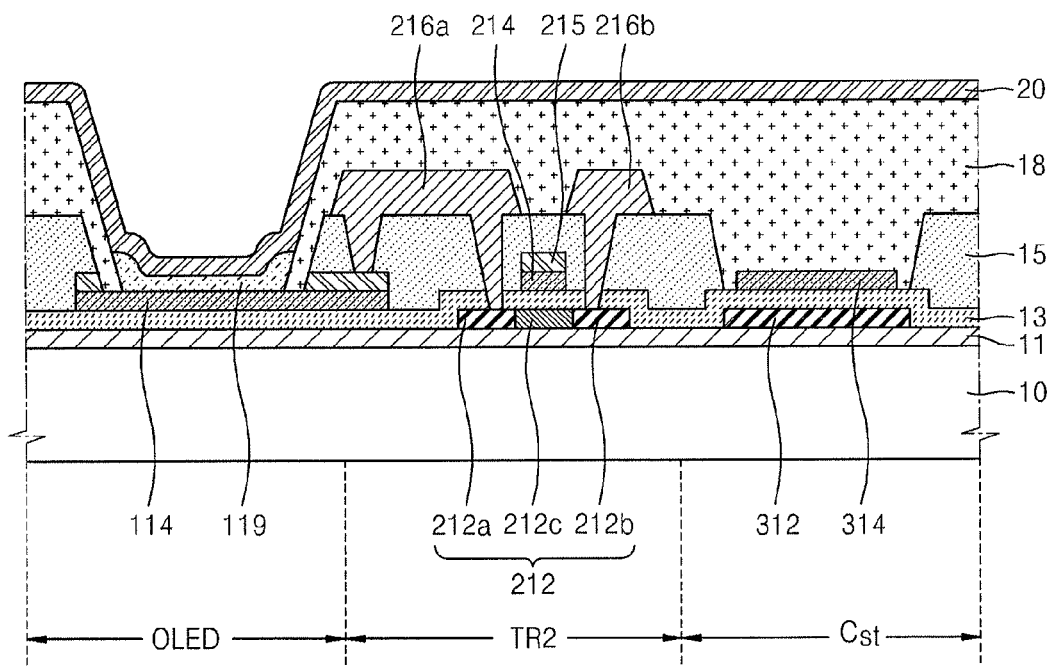
FIG. 4 illustrates a schematic cross-sectional view of some components of a pixel of the organic light emitting display apparatus of FIG. 1.

FIG. 4 is a schematic cross-sectional view of some components of a pixel of the organic light emitting display apparatus 1 of FIG. 1.

Referring to FIG. 4, a second transistor TR2, which is a driving thin-film transistor, a first capacitor $C_{st}$, and an OLED are formed on the substrate 10.

The substrate 10 may be formed of a transparent glass material of which a major component is silicon dioxide ($SiO_2$). In other implementations, the substrate 10 may be formed of a transparent plastic material.

A buffer layer 11 may be further layered on the substrate 10. The buffer layer 11 provides a flat plane on the substrate 10 and prevents permeation of moisture and alien substances.

An active layer 212 of the second transistor TR2, which includes a source area 212b, a drain area 212a, and a channel area 212c, is formed on the buffer layer 11. A gate insulation film 13 is formed on the active layer 212, and first and second gate electrode layers 214 and 215 including a transparent conductive material are sequentially formed on the gate insulation film 13 at a location corresponding to the channel area 212c of the active layer 212. A source electrode 216b and a drain electrode 216a respectively connected to the source area 212b and the drain area 212a of the active layer 212 are formed on the second gate electrode layer 215 with an inter-layer insulation film 15 intervening therebetween. A pixel definition film 18 is formed on the inter-layer insulation film 15 to cover the source electrode 216b and the drain electrode 216a.

A pixel electrode 114 is formed of the same transparent conductive material as the first gate electrode layer 214 is formed on the buffer layer 11 and the gate insulation film 13. An intermediate layer 119 including an organic light emitting layer is formed on the pixel electrode 114. A counter electrode 20 is formed as a common electrode on the intermediate layer 119. In the case of the organic light emitting display apparatus 1, the pixel electrode 114 is used as an anode, and the counter electrode 20 is used as a cathode. In other implementations, the polarities of the electrodes may be changed. Although not shown in FIG. 4, a sealing member (not shown) may be arranged on the counter electrode 20 to face one surface of the substrate 10.

Figure 5:
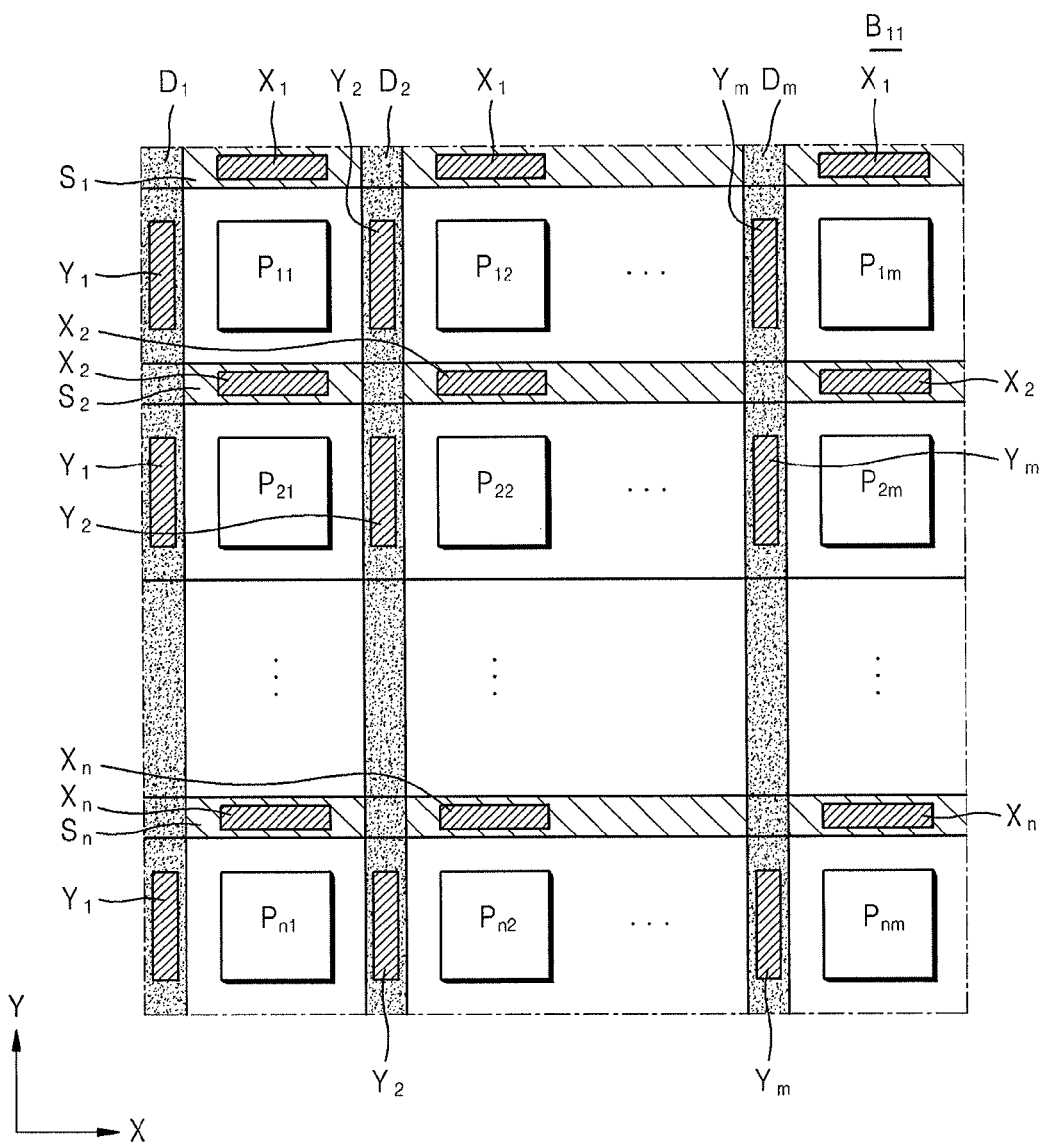
FIG. 5 illustrates a schematic diagram of some of wirings included in the organic light emitting display apparatus, which are shown in FIG. 2.

FIG. 5 is a schematic diagram of some of the wirings included in the organic light emitting display apparatus 1, which are shown in FIG. 1. For convenience of description, FIG. 5 shows only first, second, and $n^{th}$ scan wirings $S_1$, $S_2$, and $S_n$ and first, second, and $m^{th}$ data wirings $D_1$, $D_2$, and $D_m$ from among the wirings included in the organic light emitting display apparatus 1. A pixel defined by the first scan wiring $S_1$ and the first data wiring $D_1$ is marked as $P_{11}$, and the other pixels are marked as $P_{12}$, $P_{1m}$, $P_{21}$, $P_{22}$, $P_{2m}$, $P_n$, $P_{n2}$, and $P_{nm}$.

Identification patterns $X_1$, $X_2$, $X_n$, $Y_1$, $Y_2$, and $Y_m$ are formed on the first, second, and $n^{th}$ scan wirings $S_1$, $S_2$, and $S_n$ and the first, second, and $m^{th}$ data wirings $D_1$, $D_2$, and $D_m$, respectively. The identification patterns $X_1$, $X_2$, $X_n$, $Y_1$, $Y_2$, and $Y_m$ are marks formed on corresponding wirings. In detail, different scan identification patterns $X_1$, $X_2$, and $X_n$ are respectively formed on the first, second, and $n^{th}$ scan wirings $S_1$, $S_2$, and $S_n$. Accordingly, the first, second, and $n^{th}$ scan wirings $S_1$, $S_2$, and $S_n$ may be identified by the naked eye or by a device such as a microscope. Likewise, different data identification patterns $Y_1$, $Y_2$, and $Y_m$ are respectively formed on the first, second, and mth data wirings $D_1$, $D_2$, and $D_m$. Accordingly, the first, second, and $m^{th}$ data wirings $D_1$, $D_2$, and $D_m$ may be identified by the naked eye or by a device such as a microscope. The first, second, and $n^{th}$ scan identification patterns $X_1$, $X_2$, and $X_n$ formed on the first, second, and $n^{th}$ scan wirings $S_1$, $S_2$, and $S_n$ and the first, second, and $m^{th}$ data identification patterns $Y_1$, Y2, and $Y_m$ formed on the first, second, and $m^{th}$ data wirings $D_1$, $D_2$, and $D_m$ may have different patterns in a corresponding column and a corresponding row. In other implementations, the same pattern may be used in a corresponding column and a corresponding row. The first, second, and $n^{th}$ scan wirings $S_1$, $S_2$, and $S_n$ extending in the first direction X can be discriminated from the first, second, and $m^{th}$ data wirings $D_1$, $D_2$, and $D_m$ extending in the second direction Y by their extending directions. Accordingly, the scan wirings and data wirings do not have to be complicatedly embodied using different patterns.

An identification pattern is repeatedly formed on a single wiring. In detail, a plurality of pixels may be defined along a single wiring, and in this case, an identification pattern is repeatedly formed for the plurality of pixels defined along the single wiring. For example, when the number of pixels receiving a scan signal through the first scan wiring $S_1$ is m, a total of m first scan identification patterns $X_1$ are formed on the first scan wiring $S_1$. Likewise, when the number of pixels receiving a data signal through the first data wiring $D_1$ is n, a total of n first data identification patterns $Y_1$ are formed on the first data wiring $D_1$. In the same manner, identification patterns are also repeatedly formed on the second to $n^{th}$ scan wirings and the second to $m^{th}$ data wirings.

An identification pattern may be provided by a contact hole pattern formed on a wiring. Hereinafter, various embodiments of an identification pattern will be described with reference to FIGS. 6 to 10. For convenience of description, only the first, second, and $n^{th}$ scan identification patterns $X_1$, $X_2$, and $X_n$ formed on the first, second, and $n^{th}$ scan wirings $S_1$, $S_2$, and $S_n$ from among the wirings shown in FIG. 5 are shown in FIGS. 6 to 10.

Figure 6:
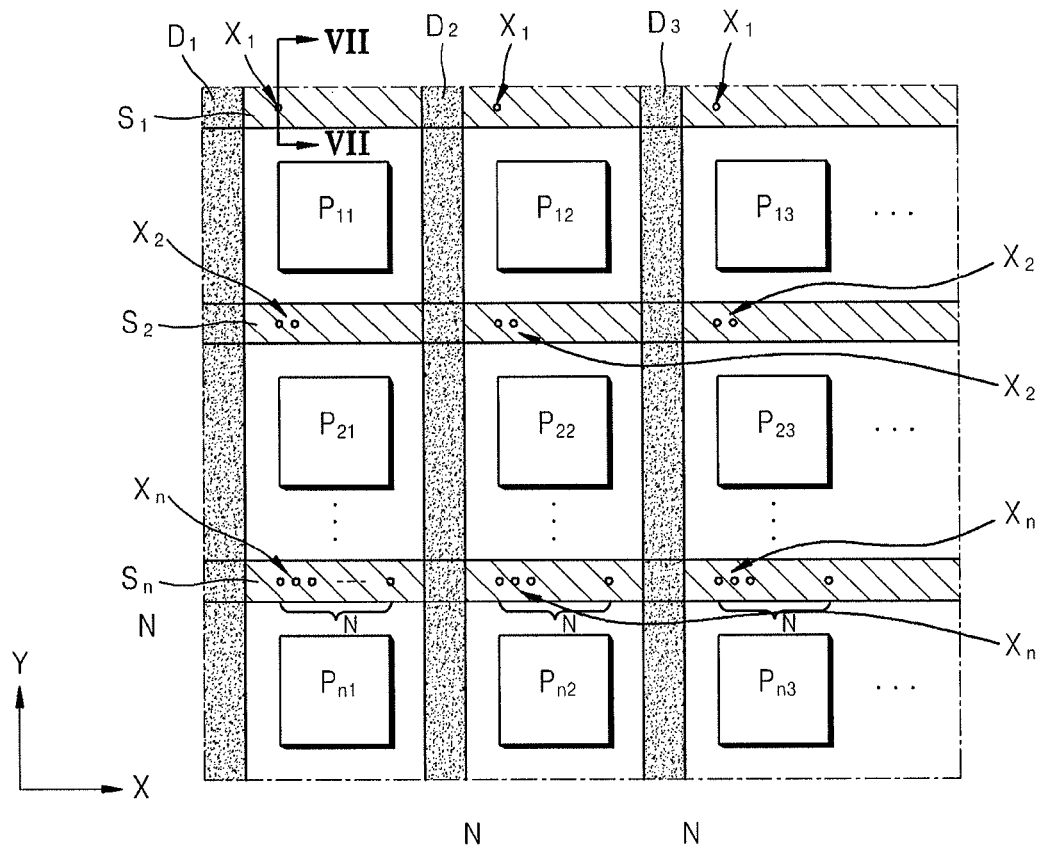
FIG. 6 illustrates an identification pattern formed on some of the wirings of FIG. 5, according to an embodiment.
Figure 7:
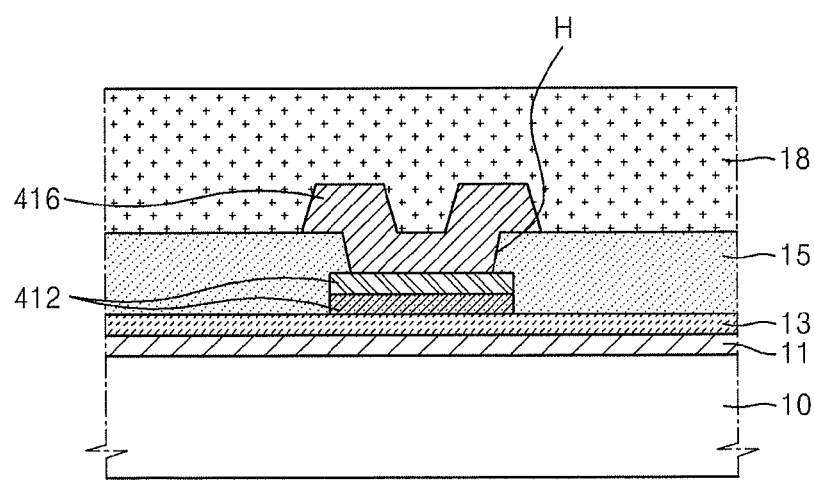
FIG. 7 illustrates a cross-sectional view through line VII-VII of the identification pattern of FIG. 6.

FIG. 6 illustrates an identification pattern formed on some of the wirings of FIG. 5, according to an embodiment. FIG. 7 is a cross-sectional view through line VII-VII of the identification pattern of FIG. 6.

Referring to FIG. 6, the identification pattern is provided by allocating a different number of contact holes to each wiring. For example, a single contact hole is formed as the first scan identification pattern $X_1$ for the first scan wiring $S_1$, two contact holes are formed as the second scan identification pattern $X_2$ for the second scan wiring $S_2$, and n contact holes are formed as the $n^{th}$ scan identification pattern $X_n$ for the $n^{th}$ scan wiring $S_n$. A wiring number of a scan wiring in each column matches the number of contact holes in this manner. Accordingly, each scan wiring may be intuitively identified.

As shown in FIG. 6, each scan identification pattern is repeatedly formed on a pixel basis. Although data identification patterns are not shown on data wirings for convenience of description, the data identification patterns may be identically or similarly to the scan identification patterns on the scan wirings.

Referring to FIG. 7, a scan wiring 412 is formed of the same material in the same layer as the first and second gate electrode layers 214 and 215 of the second transistor TR2 of FIG. 4. A contact hole formed on the scan wiring 412 is an opening H formed to expose a portion of the scan wiring 412 to the inter-layer insulation film 15 covering the scan wiring 412. The scan wiring 412 can be electrically connected via the contact hole to a conductive layer 416 formed on the inter-layer insulation film 15. The conductive layer 416 is formed of the same material in the same layer as the source and drain electrodes 216b and 216a of the second transistor TR2 of FIG. 4. A resistance of the scan wiring 412 can be reduced by electrically connecting the scan wiring 412 to the conductive layer 416 via the contact hole, thereby easily delivering a signal and a voltage.

Figure 8:
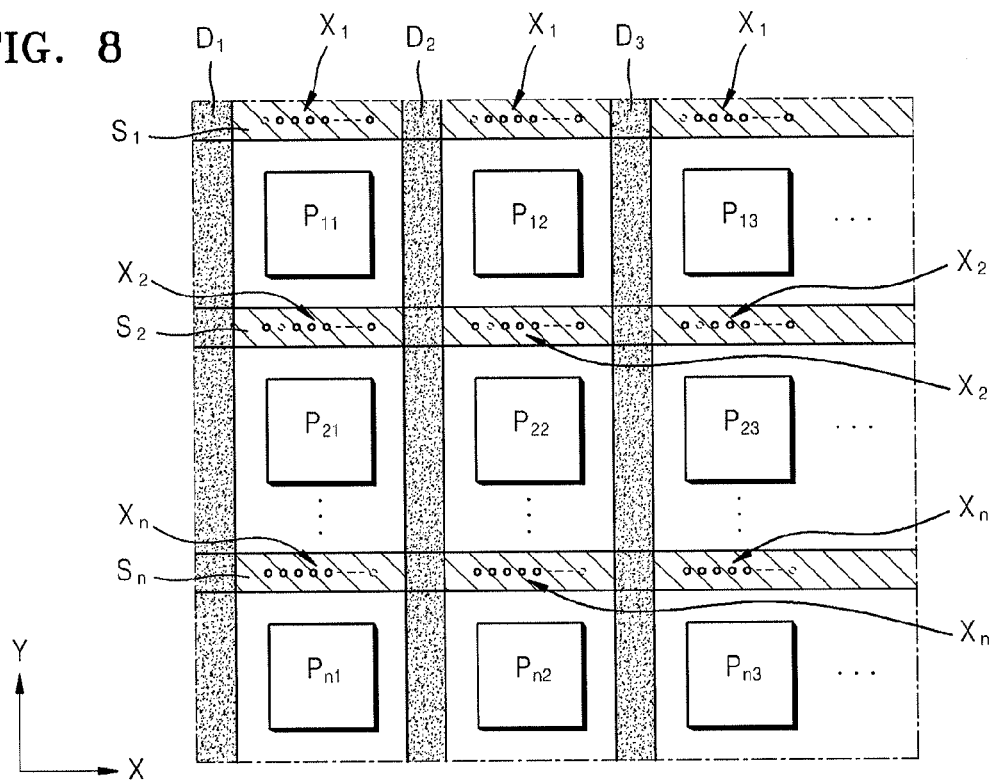
FIG. 8 illustrates an identification pattern formed on some of the wirings of FIG. 5, according to another embodiment.

FIG. 8 illustrates an identification pattern formed on some of the wirings of FIG. 5, according to another embodiment.

Referring to FIG. 8, the identification pattern is provided by differently arranging contact holes in each wiring. For example, n-1 contact holes with no contact hole at a first contact hole location are formed as the first scan identification pattern $X_1$ for the first scan wiring $S_1$, n-1 contact holes with no contact hole at a second contact hole location are formed as the second scan identification pattern $X_2$ for the second scan wiring $S_2$, and n−1 contact holes with no contact hole at an $n^{th}$ contact hole location are formed as the $n^{th}$ scan identification pattern $X_n$ for the $n^{th}$ scan wiring $S_n$. A wiring number of a scan wiring in each column is known by a contact hole arrangement in this manner. Accordingly, each scan wiring may be intuitively identified.

As shown in FIG. 8, each scan identification pattern is repeatedly formed on a pixel basis. Although data identification patterns are not shown on data wirings for convenience of description, the data identification patterns may be identically or similarly to the scan identification patterns on the scan wirings.

Figure 9:
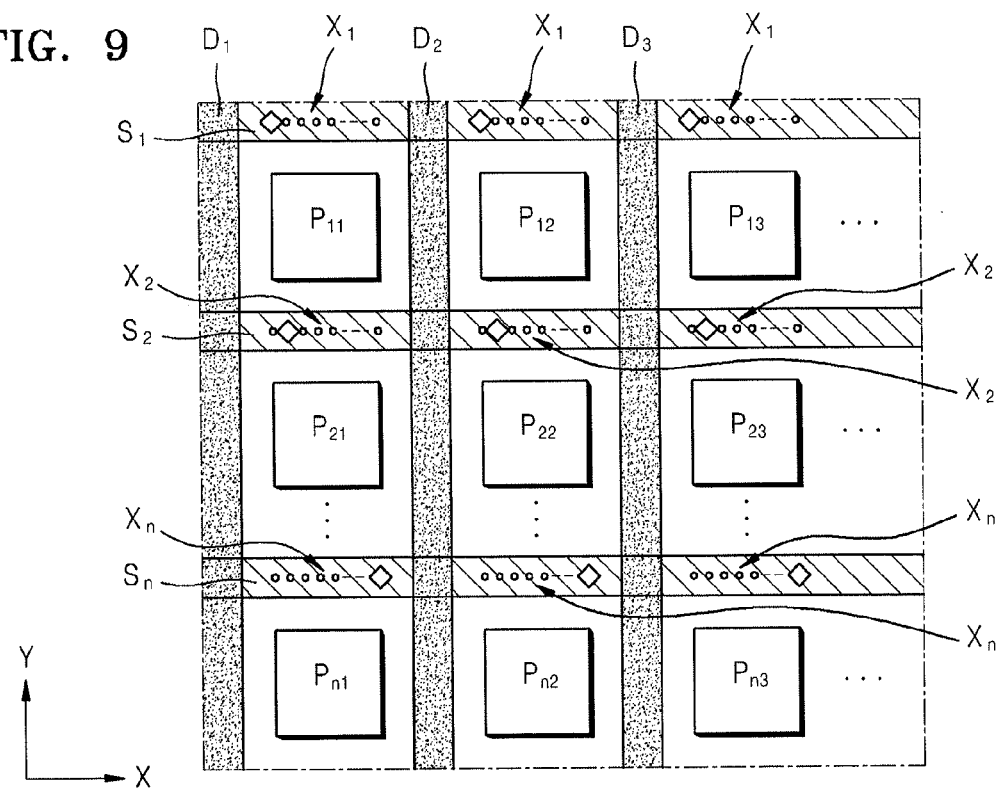
FIG. 9 illustrates an identification pattern formed on some of the wirings of FIG. 5, according to another embodiment.

FIG. 9 illustrates an identification pattern formed on some of the wirings of FIG. 5, according to another embodiment.

Referring to FIG. 9, the identification pattern is provided by allocating a different shape of contact holes to each wiring. For example, n contact holes with a circular shape except for a contact hole having a polygon shape at a first location are formed as the first scan identification pattern $X_1$ for the first scan wiring $S_1$, n contact holes with the circular shape except for a contact hole having the polygon shape at a second location are formed as the second scan identification pattern $X_2$ for the second scan wiring $S_2$, and n contact holes with the circular shape except for a contact hole having the polygon shape at an $n^{th}$ location are formed as the $n^{th}$ scan identification pattern $X_n$ for the $n^{th}$ scan wiring $S_n$. A wiring number of a scan wiring in each column is known by a contact hole shape in this manner. Accordingly, each scan wiring may be intuitively identified.

Various shapes, such as a quadrangle, pentagon, hexagon, triangle, trapezoid, or bar shape, can be used for the shape of the contact hole for identification. As shown in FIG. 9, each scan identification pattern is repeatedly formed on a pixel basis. Although data identification patterns are not shown on data wirings for convenience of description, the data identification patterns may be identically or similarly to the scan identification patterns on the scan wirings.

Figure 10:
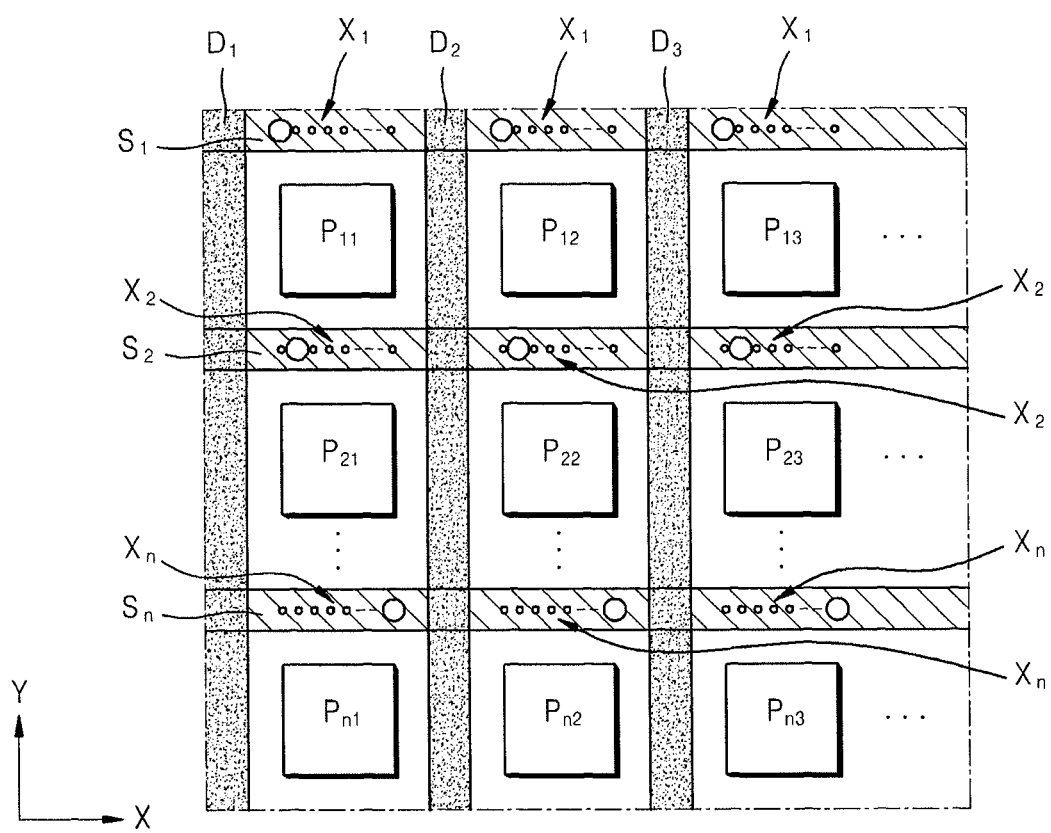
FIG. 10 illustrates an identification pattern formed on some of the wirings of FIG. 5, according to another embodiment.

FIG. 10 illustrates an identification pattern formed on some of the wirings of FIG. 5, according to another embodiment.

Referring to FIG. 10, the identification pattern is provided by allocating contact holes of different sizes to each wiring. For example, n contact holes including a contact hole at a first location, which is larger or smaller than the other contact holes, are formed as the first scan identification pattern $X_1$ for the first scan wiring $S_1$, n contact holes including a contact hole at a second location, which is larger or smaller than the other contact holes, are formed as the second scan identification pattern $X_2$ for the second scan wiring $S_2$, and n contact holes including a contact hole at an $n^{th}$ location, which is larger or smaller than the other contact holes, are formed as the $n^{th}$ scan identification pattern $X_n$ for the $n^{th}$ scan wiring $S_n$. A wiring number of a scan wiring in each column is known by a contact hole size in this manner. Accordingly, each scan wiring may be intuitively identified.

As shown in FIG. 10, each scan identification pattern is repeatedly formed on a pixel basis. Although data identification patterns are not shown on data wirings for convenience of description, the data identification patterns may be identically or similarly to the scan identification patterns on the scan wirings.

The various embodiments as described above may be applied to data wirings. An identification pattern formed on the data wirings may also be provided by applying a different number, arrangement, shape, or size of contact holes. The data wirings are formed of the same material in the same layer as the source and drain electrodes 216b and 216a of the second transistor TR2 of FIG. 4. A contact hole formed on a scan wiring is an opening formed to expose a portion of the scan wiring to a pixel definition film (refer to reference numeral 18 of FIG. 4) covering the data wiring. The identification pattern may be provided by combining two or more of the embodiments.

In a wiring structure of an organic light emitting display apparatus, various types of wirings arranged to drive the organic light emitting display apparatus overlap each other in different layers. A short may occur between wirings crossing each other, due, for example, to undesired particles generated in a manufacturing process of the organic light emitting display apparatus. To improve an image quality characteristic of the organic light emitting display apparatus, it is desirable to perform a process of repairing the short. In this regard, a process for detecting a location where the short has occurred may be performed in advance. However, it may not be easy to determine a short location of overlapping wirings, and in particular, as the number of wirings increases when a wiring pattern is completed, finding the correct short location with the naked eye may be difficult.

In contrast, embodiments may provide a display apparatus and an organic light emitting display apparatus that allow an operator to easily find a short therein. When an identification pattern is formed on each wiring as described above, a desired point can be correctly detected using the identification pattern. As such, after checking a wiring in which a short has occurred and a location at which the short has occurred by performing a bad wiring checking process and a malfunction location checking process, a repair process including laser cutting may be performed.

Referring back to FIGS. 1 and 5, an identification pattern may be repeatedly formed on wirings on a pixel block basis. In detail, each pixel block includes n×m pixels defined by n scan wirings and m data wirings. Thus, the first-first pixel block $B_{11}$ of FIG. 1 includes the first to $n^{th}$ scan wirings $S_1$ to $S_n$, in the second direction Y and the first to $m^{th}$ data wirings $D_1$ to $D_m$ in the first direction X as shown in FIG. 5. A first-second pixel block $B_{12}$ of FIG. 1 includes the first to $n^{th}$ scan wirings $S_1$ to $S_n$, in the second direction Y and $(m+1)^{th}$ to $2m^{th}$ data wirings $D_{m+1}$ to $D_{2m}$ in the first direction X. A second-first pixel block $B_{21}$ of FIG. 1 includes (n+1)th to $2n^{th}$ scan wirings $S_{n+1}$ to $S_{2n}$ in the second direction Y and the first to $m^{th}$ data wirings $D_1$ to $D_m$ in the first direction X.

As described above, an identification pattern is repeatedly formed on a single wiring. Thus, the identification pattern of the first scan wiring $S_1$ is identical to the identification pattern of the $(n+1)^{th}$ scan wiring $S_{n+1}$. In addition, the identification pattern of the second scan wiring $S_2$ is identical to an identification pattern of an $(n+2)^{th}$ scan wiring $S_{n+2}$. In the same manner, data wirings also have repeated identification patterns.

A criterion for defining a pixel block is based on the ability to display a full area in equipment for detecting a short of wirings. For example, midsize and large display apparatuses cannot display a full captured area because they have a larger size than an angle of view of a camera in equipment for detecting a short of wirings. Thus, a short is detected by capturing an area in a unit of pixel blocks obtained by dividing the area by a constant interval. When an identification pattern is repeatedly formed by setting pixel blocks as described above, wirings can be identified via a limited number of identification patterns. For example, each pixel block can be set to include a total of 100 pixels defined by 10 scan wirings and 10 data wirings. Thus, although FIG. 1 shows a total of 9 pixel blocks $B_{11}$, $B_{12}$, $B_{13}$, $B_{21}$, $B_{22}$, $B_{23}$, $B_{31}$, $B_{32}$, and $B_{33}$, other total numbers of pixel blocks may be provided.

In addition, although the above-described embodiments describe a case where an identification pattern is formed on scan wirings and data wirings, concepts disclosed herein may be applied to various kinds of power and voltage wirings and various kinds of signal wirings.

In addition, although the above-described embodiments describe an organic light emitting display apparatus having a wiring structure in which a short is easily detected, concepts disclosed herein may be applied to various display apparatuses including organic light emitting display apparatuses. Furthermore, concepts disclosed herein may be applied to detect a short in electronic devices other than display apparatuses only if a short between wirings in a mesh form may be easily detected.

According to a display apparatus and an organic light emitting display apparatus, an identification pattern is formed on each wiring, thereby making it possible to easily find a short between crossed wirings.

While the present invention has been particularly shown and described with reference to exemplary embodiments thereof, it will be understood by those of ordinary skill in the art that various changes in form and details may be made therein without departing from the spirit and scope as defined by the following claims.

What is claimed is:

1. A display apparatus, comprising:
a plurality of first wirings extending in a first direction; and
a plurality of second wirings extending in a second direction crossing the first direction,
wherein differing first identification patterns are present on the plurality of corresponding first wirings to identify individual ones of the plurality of first wirings, and differing second identification patterns are present on the plurality of corresponding second wirings to identify individual ones of the plurality of second wirings.

2. The display apparatus as claimed in claim 1, wherein:
a plurality of pixels are defined at intersections of the first wirings and the second wirings,
a single one of the first identification patterns repeats with respect to a plurality of pixels defined along a single one of the first wirings, and
a single one of the second identification patterns repeats with respect to a plurality of pixels defined along a single one of the second wirings.

3. The display apparatus as claimed in claim 2, wherein:
the first wirings, the second wirings, and the plurality of pixels defined by the first and second wirings form a pixel block,
a display area of the display apparatus includes a plurality of pixel blocks, and
the first identification patterns present on the first wirings and the second identification patterns present on the second wirings, which are included in a single pixel block, repeat on a pixel block basis.

4. The display apparatus as claimed in claim 2, wherein the first wirings are scan wirings for supplying a scan signal to the pixels.

5. The display apparatus as claimed in claim 2, wherein the second wirings are data wirings for supplying a data signal to the pixels.

6. The display apparatus as claimed in claim 1, wherein:
the first identification patterns include first contact hole patterns on the first wirings, and
the second identification patterns include second contact hole patterns on the second wirings.

7. The display apparatus as claimed in claim 6, wherein:
the first contact hole patterns include differing numbers of first contact holes allocated to each of the first wirings, and
the second contact hole patterns include differing numbers of second contact holes allocated to each of the second wirings.

8. The display apparatus as claimed in claim 6, wherein:
the first contact hole patterns include differing arrangements of first contact holes allocated to each of the first wirings, and
the second contact hole patterns include differing arrangements of second contact holes allocated to each of the second wirings.

9. The display apparatus as claimed in claim 6, wherein:
the first contact hole patterns include differing shapes of first contact holes allocated to each of the first wirings, and
the second contact hole patterns include differing shapes of second contact holes allocated to each of the second wirings.

10. The display apparatus as claimed in claim 6, wherein:
the first contact hole patterns include differing sizes of first contact holes allocated to each of the first wirings, and
the second contact hole patterns include differing sizes of second contact holes allocated to each of the second wirings.

11. An organic light emitting display apparatus, comprising:
a plurality of pixels, each pixel including an organic light emitting device, the organic light emitting device including a pixel electrode, an intermediate layer including an organic light emitting layer, a counter electrode, and a switching device, the switching device including a gate electrode and source and drain electrodes;
first wirings connected to each of the plurality of pixels, the first wirings extending in a first direction, and being on a same layer as the gate electrode; and
second wirings connected to each of the plurality of pixels, the second wirings extending in a second direction crossing the first direction, and being formed on a same layer as the source and drain electrodes,
wherein differing first identification patterns are on the corresponding first wirings to identify individual ones of the first wirings, and differing second identification patterns are on the corresponding second wirings to identify individual ones of the second wirings.

12. The organic light emitting display apparatus as claimed in claim 11, wherein:
a single one of the first identification patterns repeats with respect to a plurality of pixels defined along a single one of the first wirings, and
a single one of the second identification patterns repeats with respect to a plurality of pixels defined along a single one of the second wirings.

13. The organic light emitting display apparatus as claimed in claim 12, wherein:
the first wirings, the second wirings, and the plurality of pixels defined by the first and second wirings form a pixel block,
a display area of the organic light emitting display apparatus includes a plurality of pixel blocks, and
the first identification patterns on the first wirings and the second identification patterns on the second wirings, which are included in a single pixel block, repeat on a pixel block basis.

14. The organic light emitting display apparatus as claimed in claim 11, wherein the first wirings are scan wirings for supplying a scan signal to the pixels.

15. The organic light emitting display apparatus as claimed in claim 11, wherein the second wirings are data wirings for supplying a data signal to the pixels.

16. The organic light emitting display apparatus as claimed in claim 11, wherein:
   the first identification patterns include first contact hole patterns on the first wirings, and
   the second identification patterns include second contact hole patterns on the second wirings.

17. The organic light emitting display apparatus as claimed in claim 16, wherein:
   the first contact hole patterns include differing numbers of first contact holes allocated to each of the first wirings, and
   the second contact hole patterns include differing numbers of second contact holes allocated to each of the second wirings.

18. The organic light emitting display apparatus as claimed in claim 16, wherein:
   the first contact hole patterns include differing arrangements of first contact holes allocated to each of the first wirings, and
   the second contact hole patterns include differing arrangements of second contact holes allocated to each of the second wirings.

19. The organic light emitting display apparatus as claimed in claim 16, wherein:
   the first contact hole patterns include differing shapes of first contact holes allocated to each of the first wirings, and
   the second contact hole patterns include differing shapes of second contact holes allocated to each of the second wirings.

20. The organic light emitting display apparatus as claimed in claim 16, wherein:
   the first contact hole patterns include differing sizes of first contact holes allocated to each of the first wirings, and
   the second contact hole patterns include differing sizes of second contact holes allocated to each of the second wirings.

* * * * *